United States Patent
Koyanagi et al.

(10) Patent No.: US 8,148,184 B2
(45) Date of Patent: *Apr. 3, 2012

(54) OPTICAL DEVICE WAFER PROCESSING METHOD

(75) Inventors: Tasuku Koyanagi, Ota-Ku (JP); Hiroshi Morikazu, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/012,449

(22) Filed: Jan. 24, 2011

(65) Prior Publication Data

US 2011/0195536 A1 Aug. 11, 2011

(30) Foreign Application Priority Data

Feb. 5, 2010 (JP) .................................. 2010-024542

(51) Int. Cl.
*H01L 21/00* (2006.01)
(52) U.S. Cl. ... 438/33; 438/462; 438/463; 257/E21.214; 257/E21.237; 257/E21.238
(58) Field of Classification Search ............... 438/33, 438/68, 113, 458, 460, 463, 462; 257/E21.237, 257/E21.238, E21.214, E21.596
See application file for complete search history.

(56) References Cited

U.S. PATENT DOCUMENTS

| | | | | |
|---|---|---|---|---|
| 5,776,220 A | * | 7/1998 | Allaire et al. | ................... 65/112 |
| 6,204,472 B1 | * | 3/2001 | Muzzi et al. | ............. 219/121.67 |
| 2004/0056008 A1 | * | 3/2004 | Choo et al. | ............... 219/121.69 |
| 2006/0011593 A1 | * | 1/2006 | Fukuyo et al. | ........... 219/121.67 |

FOREIGN PATENT DOCUMENTS

| JP | 10-305420 | 11/1998 |
|---|---|---|
| JP | 3408805 | 3/2003 |

* cited by examiner

*Primary Examiner* — Khiem D Nguyen
(74) *Attorney, Agent, or Firm* — Greer, Burns & Crain, Ltd.

(57) ABSTRACT

An optical device wafer processing method for dividing an optical device wafer into a plurality of individual optical devices. The optical device wafer is composed of a substrate and a semiconductor layer formed on the front side of the substrate. The optical devices are partitioned by a plurality of crossing division lines formed on the semiconductor layer. The optical device wafer processing method includes a division start point forming step of applying a laser beam having a transmission wavelength to the substrate to the intersections of the crossing division lines in the condition where the focal point of the laser beam is set inside the substrate in an area corresponding to the intersections of the crossing division lines, thereby forming a plurality of crossing modified layers as division start points inside the substrate at the intersections of the crossing division lines; and a crack growing step of applying a $CO_2$ laser beam along the division lines to grow cracks inside the substrate from the division start points.

6 Claims, 10 Drawing Sheets

OPTICAL DEVICE WAFER PROCESSING METHOD

BACKGROUND OF THE INVENTION

1. Field of the Invention

The present invention relates to an optical device wafer processing method.

2. Description of the Related Art

An optical device wafer is composed of a substrate such as a sapphire substrate or a SiC substrate and a semiconductor layer (epitaxial layer) of gallium nitride (GaN), for example, formed on the front side of the substrate. A plurality of optical devices such as LEDs are formed in the semiconductor layer so as to be partitioned by a plurality of crossing streets (division lines). This optical device wafer has a relatively high Mohs hardness and it is therefore difficult to divide the wafer by using a cutting blade. Accordingly, a laser beam is applied to the wafer along the division lines to divide the wafer into the individual optical devices, which are used for electrical equipment such as mobile phones and personal computers.

As a method of dividing the optical device wafer into the individual optical devices by using a laser beam, the following first and second processing methods are known in the art. The first processing method includes the steps of applying a laser beam having an absorption wavelength (e.g., 355 nm) to the substrate of the wafer to an area corresponding to the division lines to thereby form an ablated groove along each division line and next applying an external force to the division lines to thereby divide the wafer into the individual optical devices (see Japanese Patent Laid-Open No. Hei 10-305420, for example).

The second processing method includes the steps of applying a laser beam having a transmission wavelength (e.g., 1064 nm) to the substrate of the wafer along the division lines in the condition where the focal point of the laser beam is set inside the substrate in an area corresponding to the division lines, thereby forming a modified layer inside the substrate along each division line and next applying an external force to the division lines to thereby divide the wafer into the individual optical devices (see Japanese Patent No. 3408805, for example). According to these processing methods, the optical device wafer can be reliably divided into the individual optical devices.

SUMMARY OF THE INVENTION

However, in the first processing method including the step of forming the ablated grooves along the division lines, there is a problem such that melted layers due to ablation may remain on the side walls surrounding each optical device, causing a reduction in luminance of each optical device. Further, in the second processing method including the step of forming the modified layers inside the substrate along the division lines, there is a problem such that the modified layers may remain on the side walls surrounding each optical device, causing a reduction in luminance of each optical device.

It is therefore an object of the present invention to provide an optical device wafer processing method which can suppress a reduction in luminance of each optical device.

In accordance with a first aspect of the present invention, there is provided an optical device wafer processing method for dividing an optical device wafer into a plurality of individual optical devices, the optical device wafer being composed of a substrate and a semiconductor layer formed on the front side of the substrate, the optical devices being partitioned by a plurality of crossing division lines formed on the semiconductor layer, the optical device wafer processing method including a division start point forming step of applying a laser beam having a transmission wavelength to the substrate to the intersections of the crossing division lines in the condition where the focal point of the laser beam is set inside the substrate in an area corresponding to the intersections of the crossing division lines, thereby forming a plurality of crossing modified layers as division start points inside the substrate at the intersections of the crossing division lines; and a crack growing step of applying a $CO_2$ laser beam along the division lines to grow cracks inside the substrate from the division start points.

In accordance with a second aspect of the present invention, there is provided an optical device wafer processing method for dividing an optical device wafer into a plurality of individual optical devices, the optical device wafer being composed of a substrate and a semiconductor layer formed on the front side of the substrate, the optical devices being partitioned by a plurality of crossing division lines formed on the semiconductor layer, the optical device wafer processing method including a division start point forming step of applying a laser beam having an absorption wavelength to the substrate to the intersections of the crossing division lines, thereby forming a plurality of crossing ablated grooves as division start points at the intersections of the crossing division lines; and a crack growing step of applying a $CO_2$ laser beam along the division lines to grow cracks inside the substrate from the division start points.

Preferably, the optical device wafer processing method further includes a wafer dividing step of applying an external force to the division lines after performing the crack growing step, thereby dividing the optical device wafer into the individual optical devices. Preferably, an atomized cooling fluid is supplied to a heated area of the optical device wafer heated by the $CO_2$ laser beam in performing the crack growing step.

According to the first aspect of the present invention, the crossing modified layers as the division start points are formed inside the substrate of the optical device wafer at the intersections of the crossing division lines. Thereafter, the $CO_2$ laser beam is applied along the division lines to grow the cracks inside the substrate of the wafer from the division start points, thereby dividing the optical device wafer into the individual optical devices. Accordingly, the modified layers hardly remain on the side walls surrounding each optical device, so that the luminance of each optical device can be improved.

According to the second aspect of the present invention, the crossing ablated grooves as the division start points are formed on the optical device wafer at the intersections of the crossing division lines. Thereafter, the $CO_2$ laser beam is applied along the division lines to grow the cracks inside the substrate of the wafer from the division start points, thereby dividing the optical device wafer into the individual optical devices. Accordingly, melted layers hardly remain on the side walls surrounding each optical device, so that the luminance of each optical device can be improved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
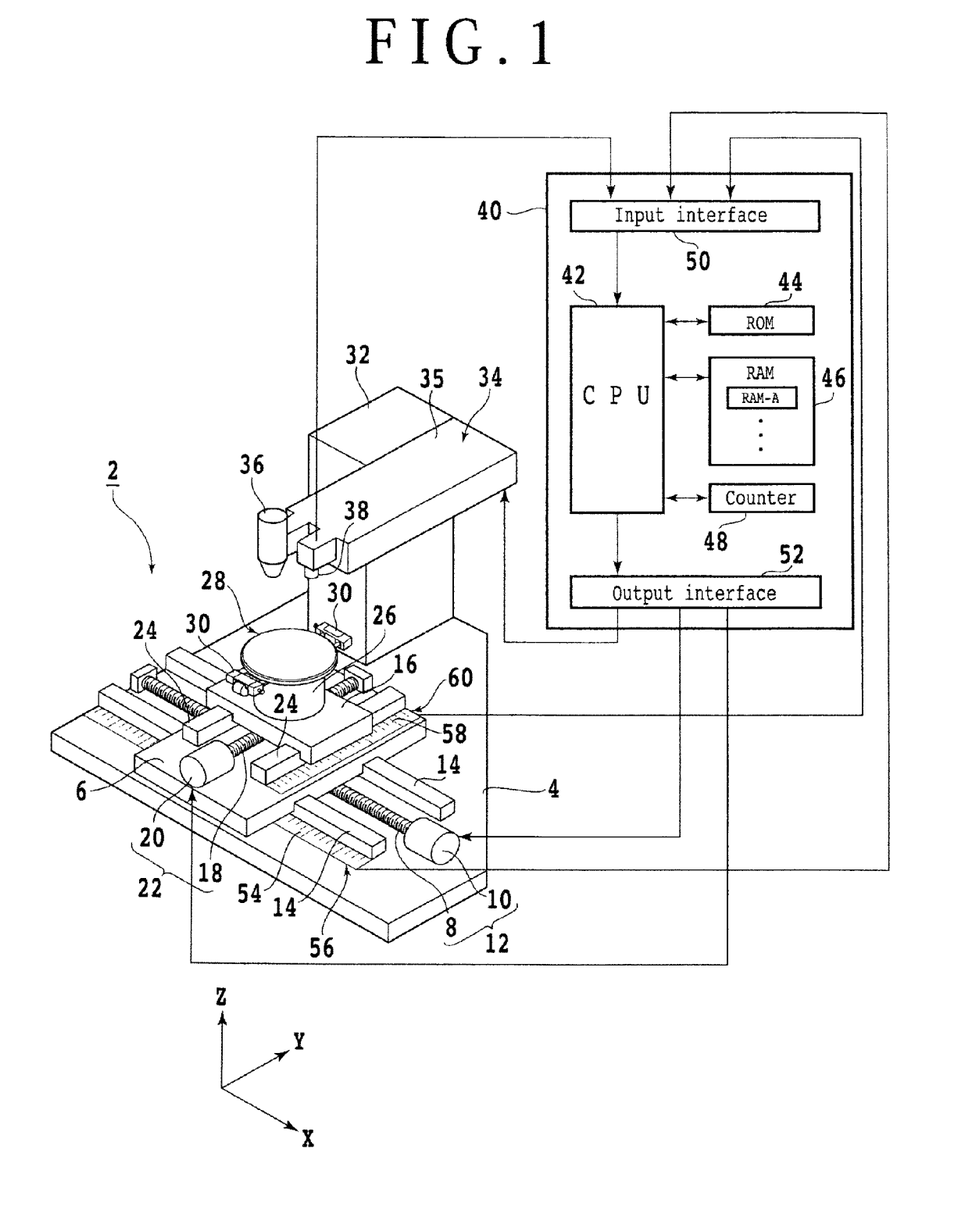
FIG. 1 is a schematic perspective view of a laser processing apparatus for performing the division start point forming step.

A preferred embodiment of the present invention will now be described in detail with reference to the drawings. FIG. 1 is a schematic perspective view of a laser processing apparatus 2 for performing the division start point forming step in the optical device wafer processing method according to the present invention. The laser processing apparatus 2 includes a stationary base 4 and a first slide block 6 supported to the stationary base 4 so as to be movable in the X direction shown by an arrow X. The first slide block 6 is movable in a feeding direction, i.e., in the X direction along a pair of guide rails 14 by feeding means 12 including a ball screw 8 and a pulse motor 10.

A second slide block 16 is supported to the first slide block 6 so as to be movable in the Y direction shown by an arrow Y. The second slide block 16 is movable in an indexing direction, i.e., in the Y direction along a pair of guide rails 24 by indexing means 22 including a ball screw 18 and a pulse motor 20. A chuck table 28 is supported through a cylindrical support member 26 to the second slide block 16. Accordingly, the chuck table 28 is movable both in the X direction and in the Y direction by the feeding means 12 and the indexing means 22. The chuck table 28 is provided with a pair of clamps 30 for clamping an optical device wafer 11 (see FIG. 2) held on the chuck table 28 under suction.

Figure 2:
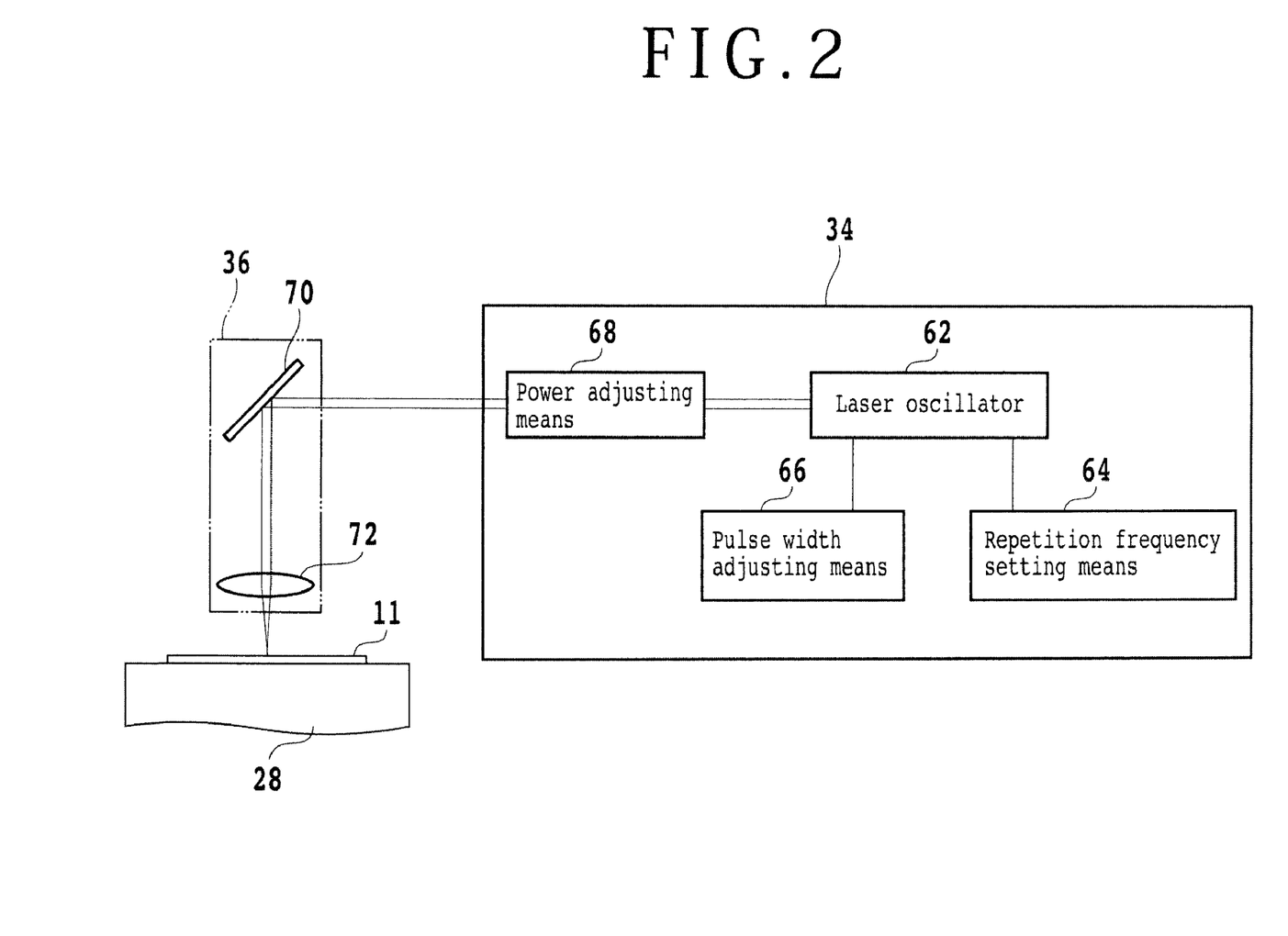
FIG. 2 is a block diagram of a laser beam applying unit.

A column 32 is provided on the stationary base 4, and a casing 35 for accommodating a laser beam applying unit 34 is mounted on the column 32. As shown in FIG. 2, the laser beam applying unit 34 includes a laser oscillator 62 such as a YAG laser oscillator or a YVO4 laser oscillator, repetition frequency setting means 64, pulse width adjusting means 66, and power adjusting means 68. A pulsed laser beam is generated by the laser oscillator 62, and the power of the pulsed laser beam is adjusted by the power adjusting means 68. Focusing means or a condenser 36 is mounted at the front end of the casing 35 and includes a mirror 70 and a focusing objective lens 72. The pulsed laser beam from the laser beam applying unit 34 is reflected by the mirror 70 and next focused by the objective lens 72 in the focusing means 36 so as to form a laser beam spot inside the optical device wafer 11 held on the chuck table 28.

Referring back to FIG. 1, imaging means 38 for detecting a processing area of the optical device wafer 11 to be laser-processed is also provided at the front end of the casing 35 so as to be juxtaposed to the focusing means 36 in the X direction. The imaging means 38 includes an ordinary imaging device such as a CCD for imaging the processing area of the optical device wafer 11 by using visible light. The imaging means 38 further includes infrared imaging means composed of infrared light applying means for applying infrared light to the optical device wafer 11, an optical system for capturing the infrared light applied to the optical device wafer 11 by the infrared light applying means, and an infrared imaging device such as an infrared CCD for outputting an electrical signal corresponding to the infrared light captured by the optical system. An image signal output from the imaging means 38 is transmitted to a controller (control means) 40.

The controller 40 is configured by a computer, and it includes a central processing unit (CPU) 42 for performing operational processing according to a control program, a read only memory (ROM) 44 preliminarily storing the control program, a random access memory (RAM) 46 for storing the results of computation, etc., a counter 48, an input interface 50, and an output interface 52.

Reference numeral 56 denotes feed amount detecting means including a linear scale 54 provided along one of the guide rails 14 and a read head (not shown) provided on the first slide block 6. A detection signal from the feed amount detecting means 56 is input into the input interface 50 of the controller 40. Reference numeral 60 denotes index amount detecting means including a linear scale 58 provided along one of the guide rails 24 and a read head (not shown) provided on the second slide block 16. A detection signal from the index amount detecting means 60 is input into the input interface 50 of the controller 40. An image signal from the imaging means 38 is also input into the input interface 50 of the controller 40. On the other hand, control signals are output from the output interface 52 of the controller 40 to the pulse motor 10, the pulse motor 20, and the laser beam applying unit 34.

Figure 3:
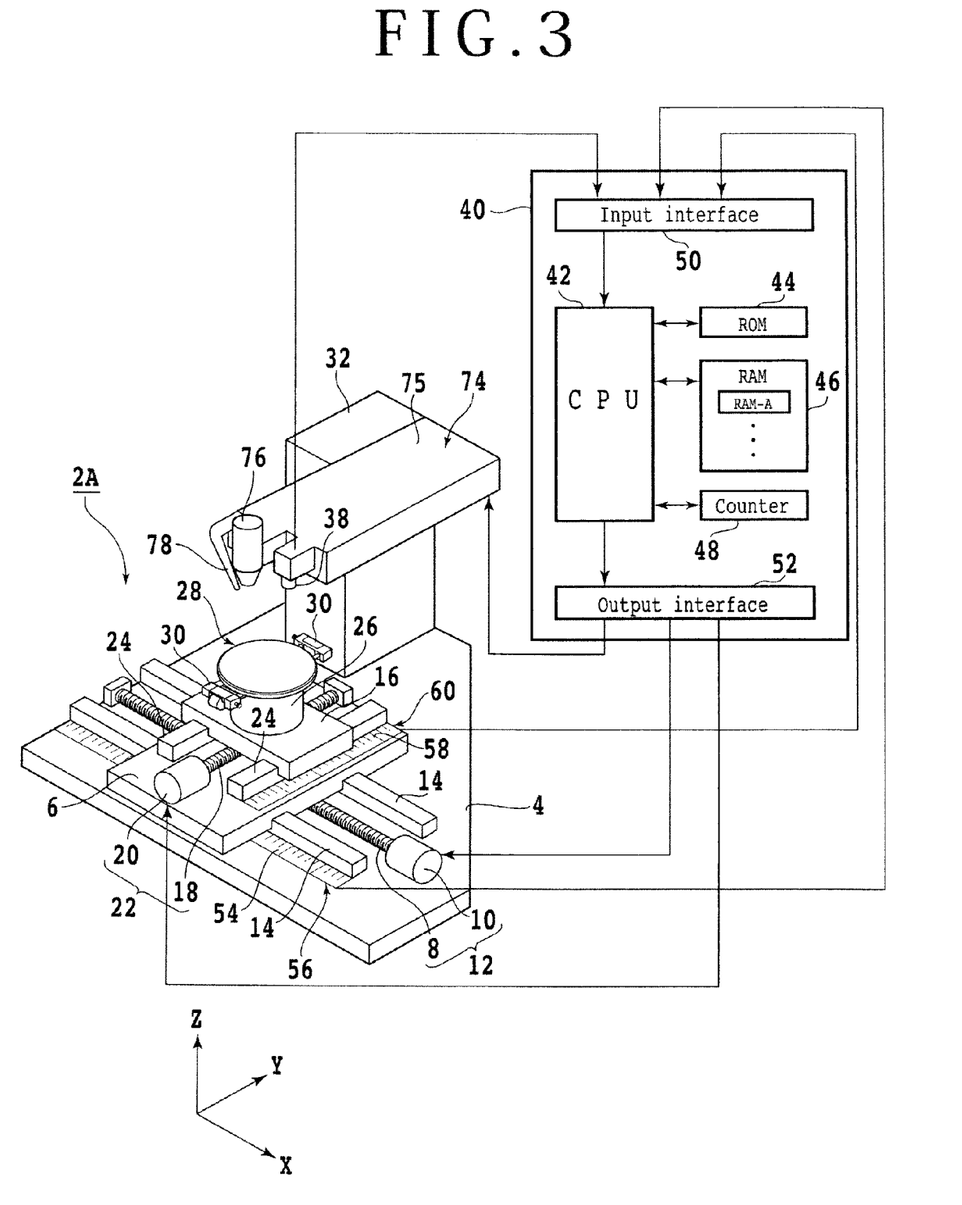
FIG. 3 is a schematic perspective view of a laser processing apparatus for performing the crack growing step.

FIG. 3 is a schematic perspective view of a laser processing apparatus 2A for performing the crack growing step in the optical device wafer processing method according to the present invention. The laser processing apparatus 2A is similar to the laser processing apparatus 2 shown in FIG. 1. Therefore, substantially the same parts as those shown in FIG. 1 are denoted by the same reference numerals in FIG. 3, and the description thereof will be omitted herein.

The laser processing apparatus 2A includes a casing 75 for accommodating a laser beam applying unit 74. The casing 75 is mounted on the column 32 provided on the stationary base 4. Although not shown, the laser beam applying unit 74 includes a $CO_2$ laser oscillator for generating a $CO_2$ laser beam and power adjusting means for adjusting the power of the $CO_2$ laser beam generated from the $CO_2$ laser oscillator. Focusing means or a condenser 76 including a mirror and a focusing objective lens is mounted at the front end of the casing 75. The $CO_2$ laser beam from the laser beam applying unit 74 is reflected by the mirror and next focused by the objective lens in the focusing means 76 so as to form a laser beam spot inside the optical device wafer 11 held on the chuck table 28.

Further provided adjacent to the focusing means 76 is a cooling fluid supplying nozzle 78 for supplying an atomized cooling fluid to a heated area of the optical device wafer 11 heated by the $CO_2$ laser beam. That is, the laser processing by the $CO_2$ laser beam is thermal processing in which heat is generated, so that the atomized cooling fluid is preferably supplied from the cooling fluid supplying nozzle 78 to the heated area of the optical device wafer 11 heated by the $CO_2$ laser beam, thereby cooling the heated area during the laser processing by the $CO_2$ laser beam. The atomized cooling fluid is provided by a mixed fluid of pure water and compressed air.

However, the supply of the cooling fluid is not essential in performing the crack growing step of the method according to the present invention.

Figure 4:
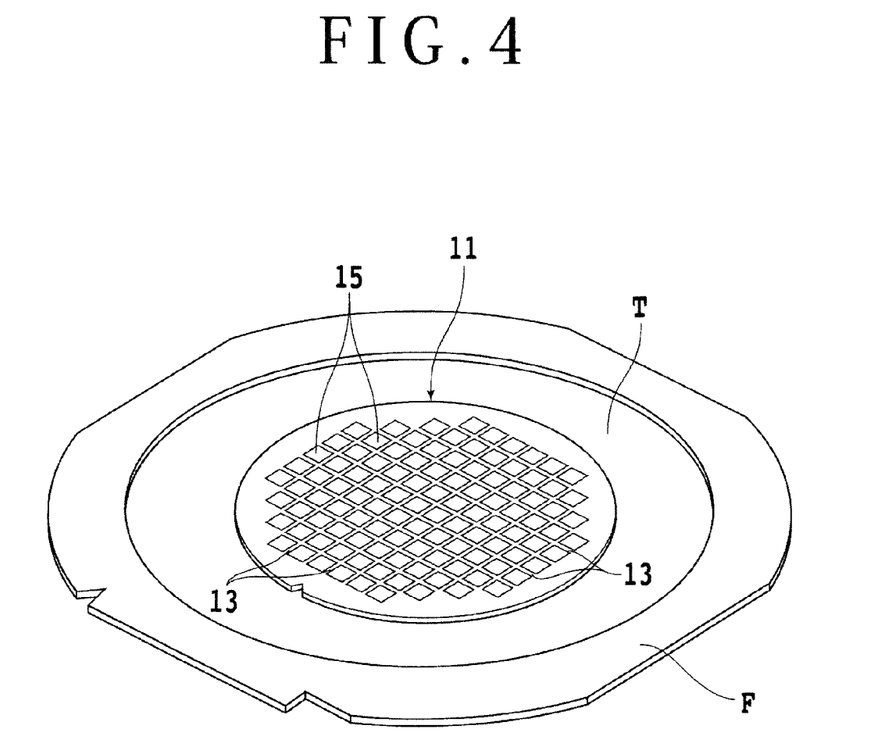
FIG. 4 is a perspective view of an optical device wafer supported through a dicing tape to an annular frame.

FIG. 4 is a perspective view of the optical device wafer 11 as an object to be processed by the present invention in the condition where the wafer 11 is attached to a dicing tape T supported to an annular frame F. The optical device wafer 11 is composed of a sapphire substrate and a semiconductor layer (epitaxial layer) of gallium nitride (GaN), for example, formed on the sapphire substrate. A plurality of crossing division lines (streets) 13 are formed on the semiconductor layer of the optical device wafer 11 to thereby partition a plurality of optical devices 15.

Figure 5:
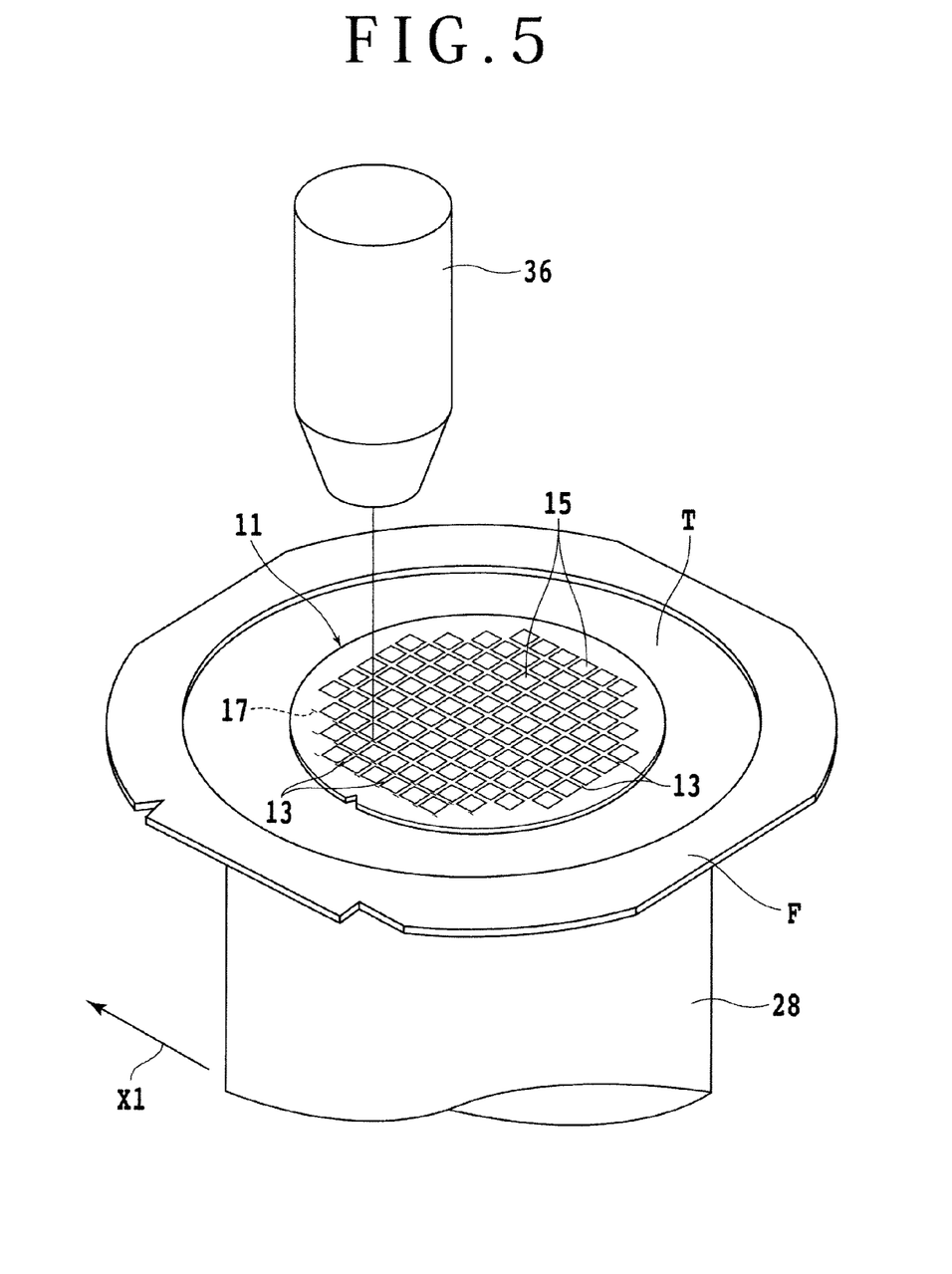
FIG. 5 is a perspective view for illustrating the division start point forming step.

A first preferred embodiment of the division start point forming step in the optical device wafer processing method according to the present invention will now be described with reference to FIGS. 5, 6A, and 6B. As shown in FIG. 5, the optical device wafer 11 supported through the dicing tape T to the annular frame F is held under suction on the chuck table 28 in the condition where the dicing tape T is in contact with the upper surface of the chuck table 28. In this condition, a laser beam having a transmission wavelength to the sapphire substrate of the optical device wafer 11 is applied from the focusing device or condenser 36 toward the wafer 11 so as to be focused inside the substrate of the wafer 11 in an area corresponding to the intersections of a predetermined one of the division lines (streets) 13 extending in a first direction and all of the division lines 13 extending in a second direction perpendicular to the first direction. Simultaneously, the chuck table 28 is moved in the feeding direction shown by an arrow X1 in FIG. 5, thereby forming a plurality of first discontinuous modified layers 17a inside the substrate of the wafer 11 along this predetermined division line 13 extending in the first direction at the intersections of this predetermined division line 13 extending in the first direction and all the division lines 13 extending in the second direction.

Figure 7:
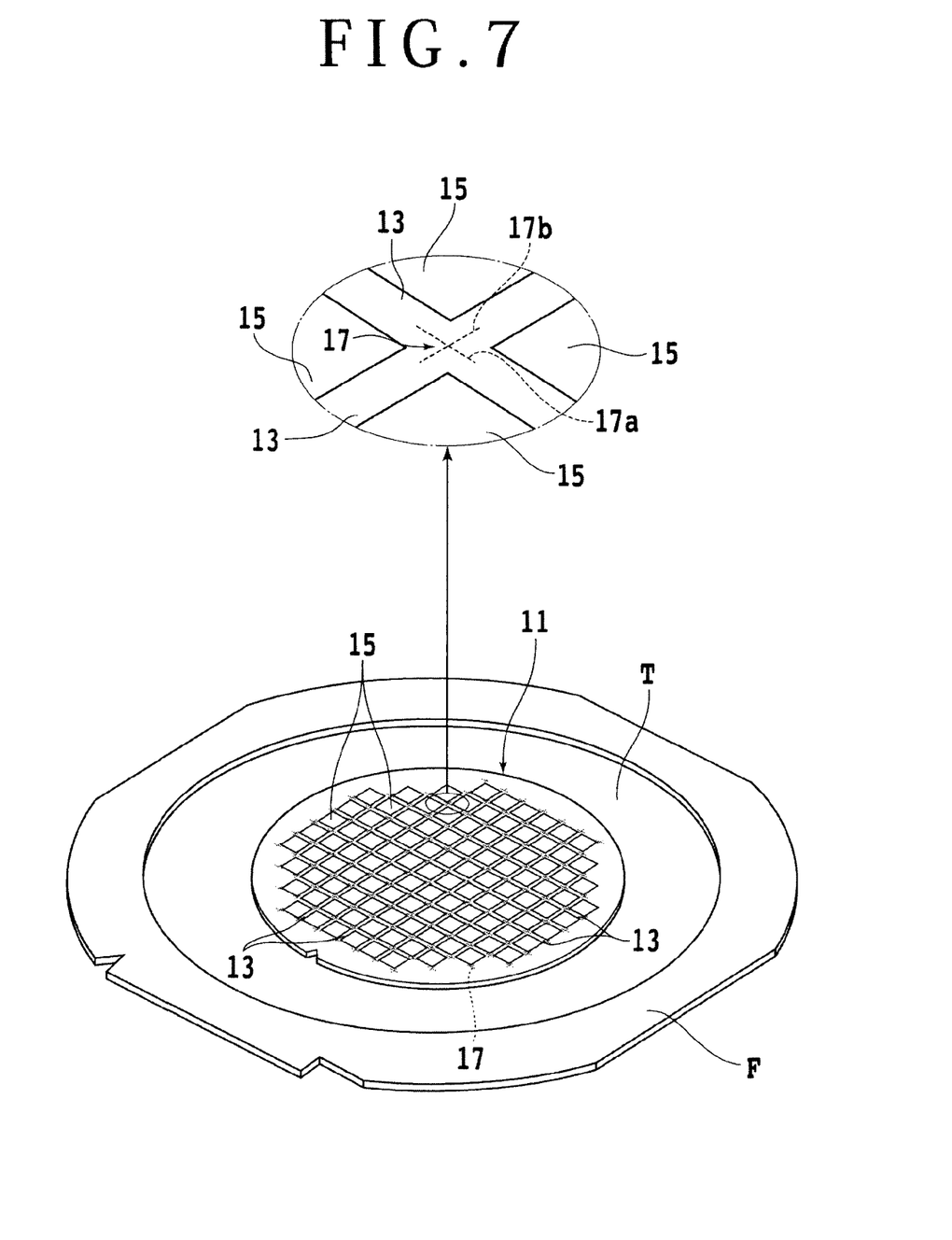
FIG. 7 is a perspective view of the wafer in the condition where crossing modified layers are formed at the intersections of all the crossing streets.

Thereafter, the chuck table 28 is stepwise moved in the indexing direction (Y direction) by a given pitch by indexing means 22, and the above laser processing is similarly performed along the other division lines 13 extending in the first direction to thereby form a plurality of first discontinuous modified layers 17a inside the substrate of the wafer 11 along all the division lines 13 extending in the first direction at the intersections of all the crossing division lines 13 extending in the first and second directions. Thereafter, the chuck table 28 is rotated 90° C. to similarly form a plurality of second discontinuous modified layers 17b (see FIG. 7) along all the division lines 13 extending in the second direction at the intersections of all the crossing division lines 13 extending in the first and second directions. FIG. 7 is a perspective view of the optical device wafer 11 in the condition where a plurality of crossing modified layers 17 as division start points are formed at the intersections of all the crossing division lines 13 extending in the first and second directions.

Figure 6A:
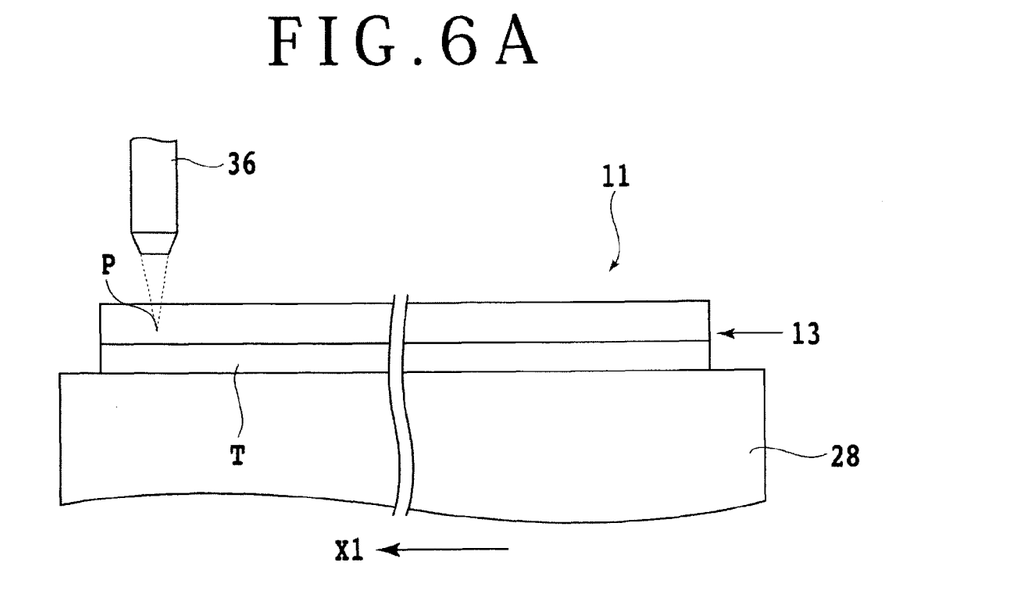
FIGS. 6A and 6B are sectional side views for illustrating the division start point forming step.
Figure 6B:
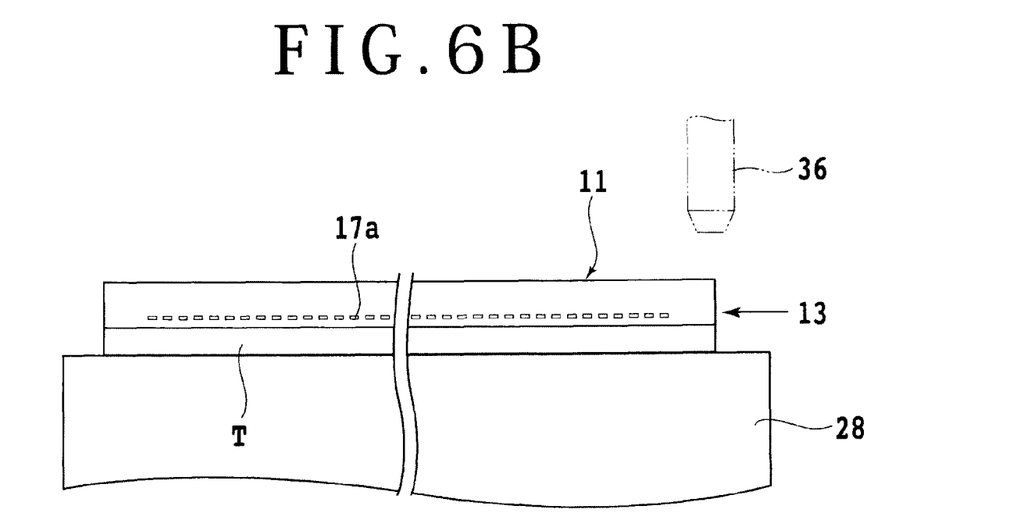

More specifically, as shown in FIG. 6A, the chuck table 28 is moved to a laser beam applying area where the focusing device 36 is located so that one end of the predetermined street 13 is positioned directly below the focusing device 36. In this condition, a pulsed laser beam having a transmission wavelength to the substrate of the optical device wafer 11 is intermittently applied from the focusing device 36 toward the wafer 11 in the condition where the focal point P of the pulsed laser beam is set inside the substrate of the wafer 11. Simultaneously, the chuck table 28 is moved in the X1 direction shown in FIG. 6A at a predetermined feed speed. When the other end of the predetermined street 13 reaches a position directly below the focusing device 36 as shown in FIG. 6B, the application of the pulsed laser beam is stopped and the movement of the chuck table 28 is also stopped. Thus, the first discontinuous modified layers 17a are formed inside the substrate of the wafer 11 along the predetermined street 13 at the intersections of this predetermined street 13 and all the streets 13 perpendicular thereto.

After forming the first discontinuous modified layers 17a along all the division lines 13 extending in the first direction at the intersections of all the crossing division lines 13 extending in the first and second directions, the chuck table 28 is rotated 90° C. to similarly form the second discontinuous modified layers 17b along all the division lines 13 extending in the second direction at the intersections of all the crossing division lines 13 extending in the first and second directions. As a result, the crossing modified layer 17 composed of the first modified layer 17a and the second modified layer 17b as shown in FIG. 7 is formed at each intersection of all the crossing division lines 13 extending in the first and second directions. This crossing modified layer 17 is formed as a melted and rehardened layer. Each crossing modified layer 17 is used as a division start point in a subsequent processing step.

The modified layer forming step (division start point forming step) mentioned above is performed under the following processing conditions, for example.

Light source: LD pumped Q-switched Nd:YVO4 pulsed laser
Wavelength: 1064 nm
Power: 0.1 W
Repetition frequency: 50 kHz
Feed speed: 200 mm/sec In the above first preferred embodiment of the division start point forming step, a laser beam having a transmission wavelength to the substrate of the optical device wafer 11 is used to form the crossing modified layers 17 inside the substrate of the wafer 11. In contrast, a second preferred embodiment of the division start point forming step will now be described, wherein a laser beam having an absorption wavelength to the substrate of the optical device wafer 11 is used to form a crossing shallow ablated groove as a division start point at each intersection of all the crossing division lines 13.

More specifically, in the second preferred embodiment of the division start point forming step, a laser beam having an absorption wavelength to the substrate of the optical device wafer 11 is used to form a plurality of first shallow discontinuous ablated grooves as division start points along all the division lines 13 extending in the first direction at the intersections of all the crossing division lines 13 extending in the first and second directions as stepwise moving the chuck table 28 in the indexing direction (Y direction). Thereafter, the chuck table 28 is rotated 90° C. to similarly form a plurality of second shallow discontinuous ablated grooves as division start points along all the division lines 13 extending in the second direction at the intersections of all the crossing division lines 13 extending in the first and second directions.

The ablated groove forming step (division start point forming step) mentioned above is performed under the following processing conditions, for example.

Figure 8:
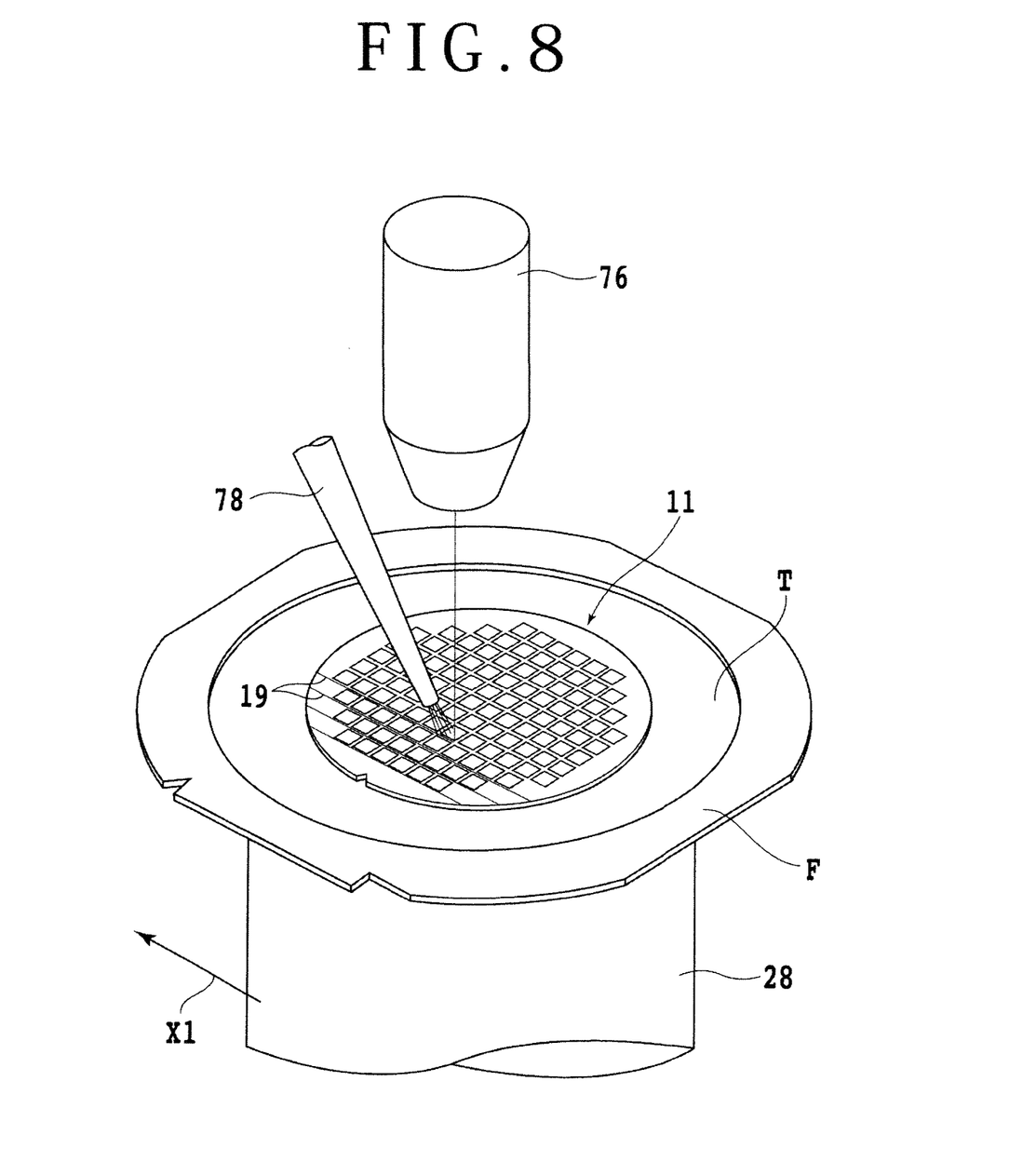
FIG. 8 is a perspective view for illustrating the crack growing step.

Light source: LD pumped Q-switched Nd:YVO4 pulsed laser
Wavelength: 355 nm (third-harmonic generation of YVO4 laser)
Power: 0.2 W
Repetition frequency: 200 kHz
Feed speed: 200 mm/sec After performing the division start point forming step as mentioned above, the crack growing step is performed by using the laser processing apparatus 2A shown in FIG. 3. In the crack growing step, a $CO_2$ laser beam is generated from the laser beam applying unit 74 and this $CO_2$ laser beam is applied from the focusing device 76 to the optical device wafer 11 held under suction on the chuck table 28 through the dicing tape T as shown in FIG. 8. That is, the optical device wafer 11 supported through the dicing tape T to the annular frame F is held under suction on the chuck table 28 in the condition where the dicing tape T is in contact with the upper surface of the chuck table 28. In this condition, the $CO_2$ laser beam is applied from the focusing device 76 to the optical device wafer 11 along the division lines 13 at whose intersections the crossing division start points 17 are formed, thereby growing cracks 19 inside the substrate of the optical device wafer 11 from the division start points 17.

More specifically, this crack growing step is first performed along all of the division lines 13 extending in the first direction as stepwise moving the chuck table 28 in the indexing direction (Y direction) by a given pitch. Thereafter, the chuck table 28 is rotated 90° to similarly perform this crack growing step along all of the division lines 13 extending in the second direction perpendicular to the first direction. The laser processing by the $CO_2$ laser beam is thermal processing in which heat is generated, so that the atomized cooling fluid composed of pure water and compressed air is preferably supplied from the cooling fluid supplying nozzle 78 adjacent to the focusing means 76 to the heated area of the optical device wafer 11 heated by the $CO_2$ laser beam, thereby cooling the heated area during the laser processing by the $CO_2$ laser beam.

The crack growing step mentioned above is performed under the following processing conditions, for example.

Light source: $CO_2$ laser
Wavelength: 10.6 μm
Power: 30 W
Feed speed: 200 mm/sec By performing this crack growing step, the optical device wafer 11 is broken along the cracks 19 to obtain the individual optical devices 15. However, there is a case that the depth of some of the cracks 19 may be insufficient, causing a poor break of the wafer 11. In this case, a wafer dividing step is performed by using a dividing apparatus 80 shown in FIG. 9 to completely divide the optical device wafer 11 into the individual optical devices 15.

Figure 9:
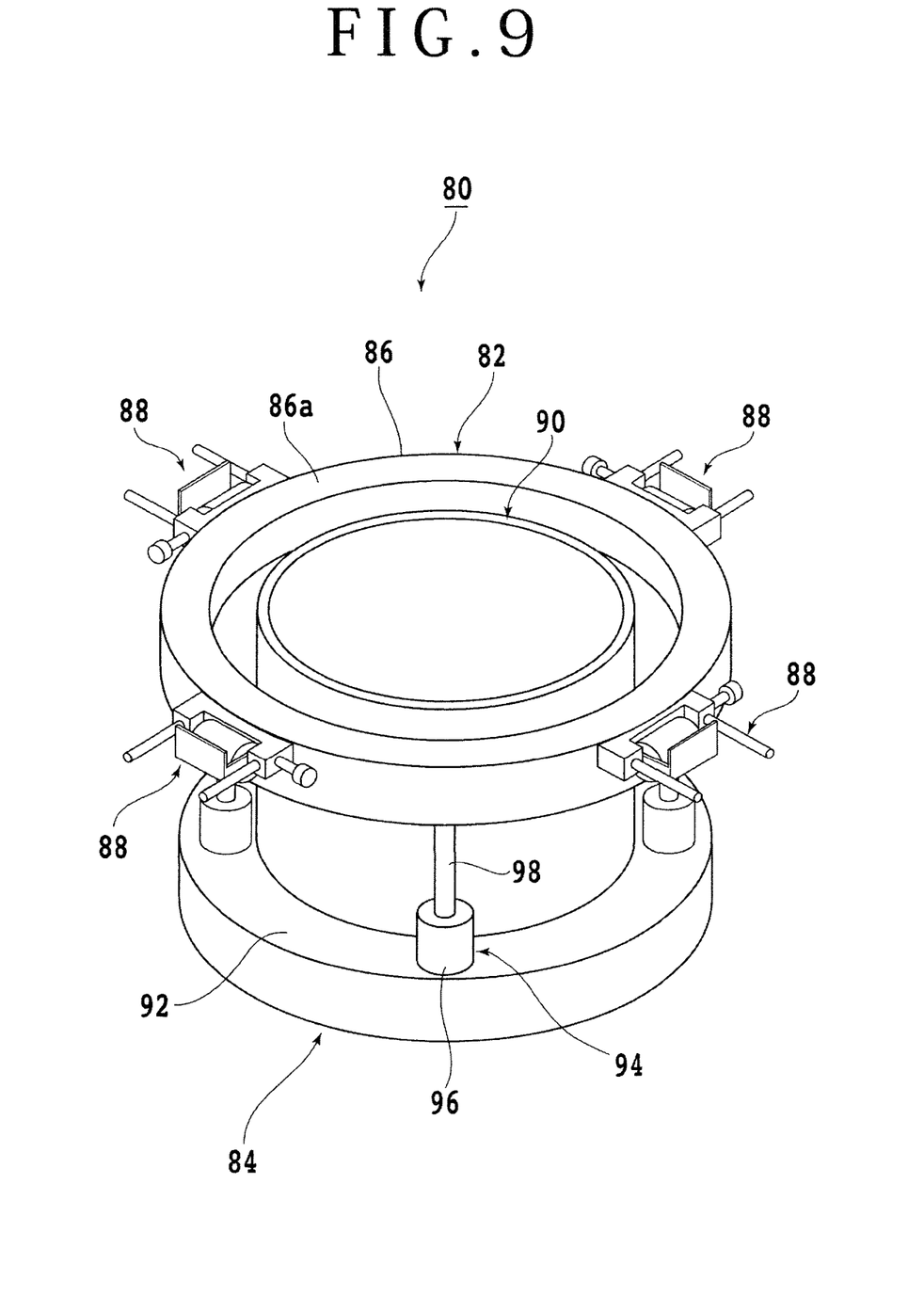
FIG. 9 is a perspective view of a dividing apparatus.

The dividing apparatus 80 shown in FIG. 9 includes frame holding means 82 for holding the annular frame F and tape expanding means 84 for expanding the dicing tape T supported to the annular frame F held by the frame holding means 82. The frame holding means 82 includes an annular frame holding member 86 and a plurality of clamps 88 as fixing means provided on the outer circumference of the frame holding member 86. The upper surface of the frame holding member 86 functions as a mounting surface 86a for mounting the annular frame F thereon.

The annular frame F mounted on the mounting surface 86a is fixed to the frame holding member 86 by the clamps 88. The frame holding means 82 is supported by the tape expanding means 84 so as to be vertically movable. The tape expanding means 84 includes an expanding drum 90 provided inside of the annular frame holding member 86. The expanding drum 90 has an inner diameter smaller than the inner diameter of the annular frame F and an inner diameter larger than the outer diameter of the optical device wafer 11 attached to the dicing tape T supported to the annular frame F.

The expanding drum 90 has a supporting flange 92 integrally formed at the lower end of the drum 90. The tape expanding means 84 further includes driving means 94 for vertically moving the annular frame holding member 86. The driving means 94 is composed of a plurality of air cylinders 96 provided on the supporting flange 92. Each air cylinder 96 is provided with a piston rod 98 connected to the lower surface of the frame holding member 86. The driving means 94 composed of the plural air cylinders 96 functions to vertically move the annular frame holding member 86 so as to selectively take a reference position where the mounting surface 86a is substantially equal in height to the upper end of the expanding drum 90 and an expansion position where the mounting surface 86a is lower in height than the upper end of the expanding drum 90 by a predetermined amount.

Figure 10A:
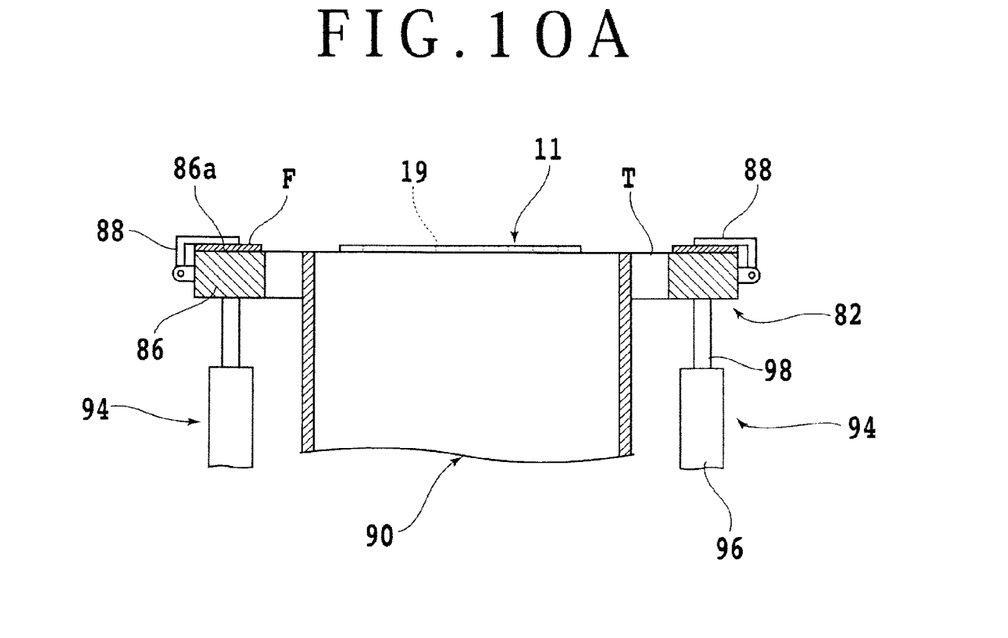
FIGS. 10A and 10B are sectional side views for illustrating the wafer dividing step.

The wafer dividing step using the dividing apparatus 80 will now be described with reference to FIGS. 10A and 10B. As shown in FIG. 10A, the annular frame F supporting the optical device wafer 11 through the dicing tape T is mounted on the mounting surface 86a of the frame holding member 86 and fixed to the frame holding member 86 by the clamps 88. At this time, the frame holding member 86 is set at the reference position where the height of the mounting surface 86a is substantially the same as that of the upper end of the expanding drum 90.

Figure 10B:
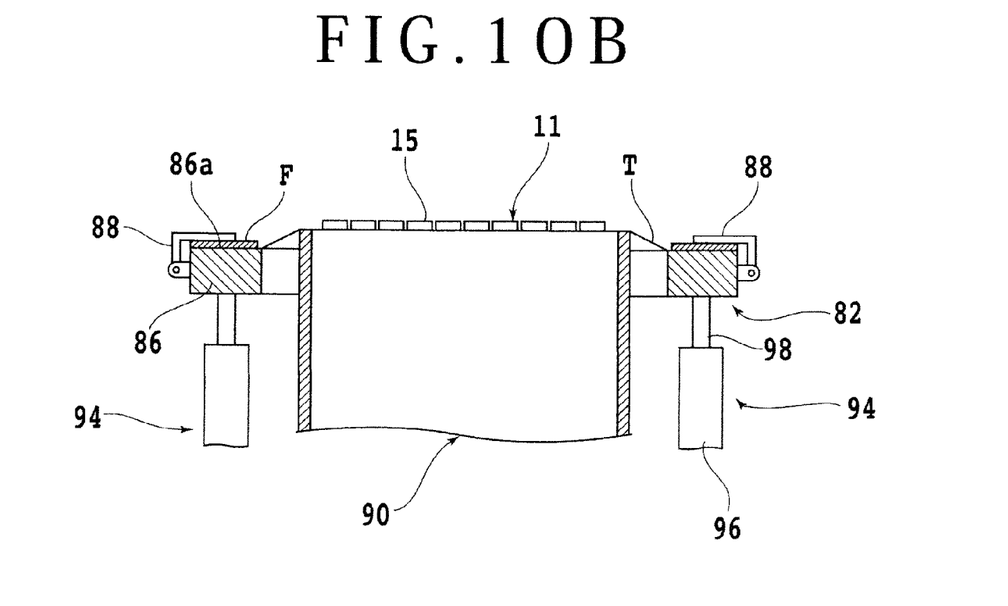

Thereafter, the air cylinders 96 are driven to lower the frame holding member 86 to the expansion position shown in FIG. 10B. Accordingly, the annular frame F fixed to the mounting surface 86a of the frame holding member 86 is also lowered, so that the dicing tape T supported to the annular frame F comes into abutment against the upper end of the expanding drum 90 and is expanded mainly in the radial direction of the expanding drum 90 as shown in FIG. 10B. As a result, a tensile force is radially applied to the optical device wafer 11 attached to the dicing tape T. When a tensile force is radially applied to the optical device wafer 11, the optical device wafer 11 is broken along the cracks 19 formed along the division lines 13, thereby dividing the optical device wafer 11 into the individual optical devices 15.

According to the first preferred embodiment of the division start point forming step, the crossing modified layers 17 as the division start points are formed inside the substrate of the optical device wafer 11 at the intersections of the crossing division lines 13. Thereafter, the $CO_2$ laser beam is applied along the division lines 13 to grow the cracks 19 inside the substrate of the wafer 11 from the division start points 17, thereby dividing the wafer 11 into the individual optical devices 15. Accordingly, even when the modified layers are formed inside the substrate of the wafer 11 by applying a laser beam, the modified layers hardly remain on the side walls surrounding each optical device 15, so that the luminance of each optical device 15 can be improved.

According to the second preferred embodiment of the division start point forming step, the crossing ablated grooves as the division start points are formed on the optical device wafer 11 at the intersections of the crossing division lines 13. Thereafter, the $CO_2$ laser beam is applied along the division lines 13 to grow the cracks 19 inside the substrate of the wafer 11 from the division start points, thereby dividing the optical device wafer 11 into the individual optical devices 15. Accordingly, even when the ablated grooves are formed on the wafer 11 by applying a laser beam, melted layers hardly remain on the side walls surrounding each optical device 15, so that the luminance of each optical device 15 can be improved.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device wafer processing method for dividing an optical device wafer into a plurality of individual optical devices, said optical device wafer being composed of a substrate and a semiconductor layer formed on a front side of said substrate, said optical devices being partitioned by a plurality of crossing division lines formed on said semiconductor layer, said optical device wafer processing method comprising:

a division start point forming step of applying a laser beam having a transmission wavelength to said substrate at intersections of said crossing division lines in a condition where a focal point of said laser beam is set inside said substrate in an area corresponding to the intersections of said crossing division lines, thereby forming a plurality of crossing modified layers as division start points inside said substrate at the intersections of said crossing division lines; and a crack growing step of applying a $CO_2$ laser beam along said division lines to grow cracks inside said substrate from said division start points.

2. The optical device wafer processing method according to claim 1, further comprising a wafer dividing step of applying an external force to said division lines after performing said crack growing step, thereby dividing said optical device wafer into said individual optical devices.

3. The optical device wafer processing method according to claim 1, wherein an atomized cooling fluid is supplied to a heated area of said optical device wafer heated by said $CO_2$ laser beam in performing said crack growing step.

4. An optical device wafer processing method for dividing an optical device wafer into a plurality of individual optical devices, said optical device wafer being composed of a substrate and a semiconductor layer formed on a front side of said substrate, said optical devices being partitioned by a plurality of crossing division lines formed on said semiconductor layer, said optical device wafer processing method comprising:

a division start point forming step of applying a laser beam having an absorption wavelength to said substrate at intersections of said crossing division lines, thereby forming a plurality of crossing ablated grooves as division start points at the intersections of said crossing division lines; and a crack growing step of applying a $CO_2$ laser beam along said division lines to grow cracks inside said substrate from said division start points.

5. The optical device wafer processing method according to claim 4, further comprising a wafer dividing step of applying an external force to said division lines after performing said crack growing step, thereby dividing said optical device wafer into said individual optical devices.

6. The optical device wafer processing method according to claim 4, wherein an atomized cooling fluid is supplied to a heated area of said optical device wafer heated by said $CO_2$ laser beam in performing said crack growing step.

* * * * *